United States Patent
Shimoda et al.

(10) Patent No.: US 6,967,114 B2
(45) Date of Patent: Nov. 22, 2005

(54) LARGE EL PANEL AND MANUFACTURING METHOD THEREFOR

(75) Inventors: Tatsuya Shimoda, Suwa (JP); Takao Nishikawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 78 days.

(21) Appl. No.: 10/617,746

(22) Filed: Jul. 14, 2003

(65) Prior Publication Data

US 2004/0014252 A1   Jan. 22, 2004

Related U.S. Application Data

(62) Division of application No. 09/856,852, filed as application No. PCT/JP00/06622 on Sep. 26, 2000, now Pat. No. 6,642,542.

(30) Foreign Application Priority Data

Sep. 30, 1999   (JP) ................................. 11-280843

(51) Int. Cl.[7] .............................................. H01L 21/00
(52) U.S. Cl. ........................... 438/22; 438/29; 438/149
(58) Field of Search ............................ 438/22, 29, 25, 438/28, 69, 149

(56) References Cited

U.S. PATENT DOCUMENTS

| | | | | |
|---|---|---|---|---|
| 3,861,783 A | * | 1/1975 | Dill et al. .................... | 349/156 |
| 4,408,836 A | * | 10/1983 | Kikuno ........................ | 349/73 |
| 5,164,853 A | * | 11/1992 | Shimazaki ................... | 349/73 |
| 5,302,468 A | | 4/1994 | Namiki et al. | |
| 5,550,066 A | | 8/1996 | Tang et al. | |
| 5,673,091 A | | 9/1997 | Boisdron et al. ............. | 438/58 |
| 5,796,452 A | * | 8/1998 | Pierson ......................... | 349/73 |
| 5,801,797 A | * | 9/1998 | Iida et al. ..................... | 349/73 |
| 5,847,785 A | * | 12/1998 | Izumi ........................... | 349/73 |
| 5,903,328 A | * | 5/1999 | Greene et al. ................ | 349/73 |
| 6,078,379 A | * | 6/2000 | Nagae et al. ................. | 349/155 |
| 6,144,425 A | * | 11/2000 | Kawabata et al. ............ | 349/73 |
| 6,246,070 B1 | | 6/2001 | Yamazaki et al. ............ | 257/40 |
| 6,317,175 B1 | * | 11/2001 | Salerno et al. ................ | 349/45 |
| 6,417,898 B1 | * | 7/2002 | Izumi ........................... | 349/73 |

FOREIGN PATENT DOCUMENTS

| | | |
|---|---|---|
| JP | 59-147176 U | 10/1984 |
| JP | 1-297864 A | 11/1989 |
| JP | 5-205875 A | 8/1993 |
| JP | 6-61023 B2 | 8/1994 |
| JP | 7-302685 A | 11/1995 |
| JP | 8-241047 A | 9/1996 |
| JP | 10-125930 A | 5/1998 |

(Continued)

Primary Examiner—Tuan H. Hguyen
(74) Attorney, Agent, or Firm—Oliff & Berridge, PLC (57) ABSTRACT

A manufacturing method is disclosed for a large EL panel in which a plurality of EL display panels are used. Each of said plurality of EL display panels are constructed of an EL display device and a sub-transparent substrate. The EL display device includes a base layer over which a luminescent material is applied, an electrode layer which is laminated on one side of said base layer, and a TFT layer including a circuit section. The circuit section of a TFT layer is disposed behind an adjacent EL display device. Thus, the EL display devices appear to be unified, forming a large EL display panel. In addition, in the case of in which a plurality of EL display devices are arranged in a matrix pattern, pitch between the pixels provided in the pixel section of the TFT array is maintained constant.

12 Claims, 12 Drawing Sheets

FOREIGN PATENT DOCUMENTS

| | | |
|---|---|---|
| JP | 10-125931 A | 5/1998 |
| JP | 11-260549 A | 9/1999 |
| JP | 2000-150173 A | 5/2000 |
| WO | WO 99/46961 | 9/1999 |

* cited by examiner

LARGE EL PANEL AND MANUFACTURING METHOD THEREFOR

This is a Division of Application Ser. No. 09/856,852 filed May 29, 2001. The entire disclosure of the prior application is hereby incorporated by reference herein in its entirety.

BACKGROUND OF THE INVENTION

1. Field of the Invention

The present invention relates to a large EL panel formed by a plurality of EL display devices, such as organic EL panels, which are arranged in a matrix pattern, and also relates to a manufacturing method for the large EL panel.

2. Description of the Related Art

Small EL flat panels (EL display devices) driven by polysilicon TFTs are usually laminated on a hard and transparent substrate by an adhesive, etc., in order to maintain the flatness thereof. Each of the TFTs control the driving of one of multiple pixels in the EL display devices, so that plane images are displayed.

The EL display devices as described above are typically two to six inches in length measured in a diagonal direction, and provide excellent functions as small image displays.

Conventionally, in theaters and stadiums, large screens, which are capable of displaying clear images, are commonly used in place of electrical scoreboards. In such large screens, a plurality of light sources, such as the above-described EL display devices, light bulbs are arranged in a matrix pattern. Each of the light sources functions as a pixel for forming an image.

In such theaters and stadiums, there is a sufficient distance between the screen and the audience; therefore, the EL display devices having a diagonal length of, for example, several inches should not be a problem.

Recently, on the other hand, instead of CRTs, liquid crystal display panels have been commonly used as displays for televisions and personal computers. In addition, there has been a demand to increase the sizes of the liquid crystal display panels.

In a liquid crystal display, an additional light source is required as a backlight. Thus, to increase the size of the liquid crystal display, the size of the backlight must also be increased. The present situation, however, is such that when a large (50 to 100 inches in diagonal length) and thin display is required, an amount of heat, which increases along with the size of the backlight, will be too large. In addition, the thickness of the display cannot be made thin enough to satisfy the requirement.

Accordingly, the use of the EL display devices driven by TFTs, which will be referred to as TFT-EL display devices in the following disclosure, has been considered. In the TFT-EL display devices, the backlights are not required. In addition, due to the use of the TFTs, the number of pixels may be increased, and response rate becomes higher, so that high-resolution images may be displayed.

Large TFT-EL display devices, however, have not been realized. Accordingly, to form a large display panel which is 20 to 100 inches in diagonal length, small TFT-EL display devices, which are several inches in diagonal length, must be arranged in a matrix pattern.

In addition, a TFT array includes not only a pixel section but also a circuit (driver) section for individually controlling the light emission at the pixels. The circuit section is disposed at a region outside of an image forming area, and prevents the adjacent EL display devices from being arranged in close proximity to each other.

SUMMARY OF THE INVENTION

In consideration of the above-described structures and their limitations, an object of the present invention is to provide a large EL display panel and a manufacturing method thereof, in which a plurality of EL devices are arranged in a matrix pattern, and in which a pitch between the pixels in the TFT array is maintained constant.

The present invention provides a large EL panel including a plurality of EL display devices which are arranged in a matrix pattern on a main transparent substrate which is capable of supporting multiple EL display devices. Each of the EL display devices includes: a base layer over which a luminescent material is applied; an electrode layer which is laminated on one side of the base layer; and a TFT layer. The TFT layer includes a circuit section in which light emission of the luminescent material is controlled by applying a predetermined voltage between the electrode layer and the TFT layer and a pixel section which is superimposed over the other side of the base layer and which is provided with a plurality of pixels which divide the base layer into sections so that light emission of the luminescent material in each section is individually controlled by generating a potential difference between the electrode layer and the TFT layer at the corresponding section. The circuit section of the TFT layer, which is disposed at the region outside a light emitting area, is disposed behind the adjacent EL display devise so that light emitting areas of the adjacent EL display devices are arranged in proximity to each other and separated by a predetermined gap.

In addition, the present invention also provides a method for a large EL panel in which a plurality of EL display panels are used, each of the EL display panels being constructed of the above-described EL display device and sub-transparent substrate that supports the EL display device. The, manufacturing method for the large EL display panel includes the steps of: removing the EL display devices from the sub-transparent substrates; arranging the obtained EL display device on a main transparent substrate, which is broader than the sub-transparent substrate, in a matrix pattern and in a manner such that light emitting areas of the adjacent EL display devices are in proximity to each other; and disposing and fixing the circuit section of the TFT layer, which is disposed at the region outside the light emitting area, behind the adjacent EL display device.

In the case in which a large display panel is formed by using the EL display devices, a problem has occurred that sub-transparent substrate, which are larger than the EL display devices, prevent the EL display devices from being arranged in proximity to each other. Accordingly, by applying, for example, separation and transfer techniques described in Japanese Unexamined Patent Application Publication Nos. 10-125930 and 10-125931, it is possible to arrange the EL display devices in proximity to each other.

With the above-described techniques, the EL display devices may be separated from the sub-transparent substrates by applying a mechanical or chemical force to adhesive layers which are disposed therebetween, and may be transferred to another substrate.

Each of the TFT layers has a pixel section and a circuit section. The pixel section is superimposed over the light emitting area, so that no problems occur. In contrast, however, the circuit section is disposed at the periphery, usually at two sides, of the TFT layer, and at the region outside the light emitting area. Accordingly, the circuit section prevents the adjacent EL display devices from being arranged in proximity to each other, so that the ability of the TFTs to display high-resolution images cannot be sufficiently exploited. According to the present invention, however, the circuit section is disposed behind the adjacent EL display device, so that a high resolution and large EL display panel may be constructed.

The manufacturing process of the large LE display panel will be described below. First, the EL display devices are removed from the sub-transparent substrates by using the above-described separation and transfer technique. Then, the EL display devices are arranged on a main transparent substrate, which is broader than the sub-transparent substrate, in a matrix pattern in a manner such that the light emitting areas of the adjacent EL display devices are in proximity to each other. Then, the circuit section of the TFT layer, which is disposed at the region outside the light emitting area, is disposed and fixed behind the adjacent EL display devices.

According to the present invention, the EL display devices are several inches in diagonal length, and the main transparent substrate is 20 to 100 inches in diagonal length.

In addition, the predetermined amount of gap between the light emitting areas of the EL display devices is approximately the same as the pitch between pixels provided in the pixel section of the TFT layer.

To dispose the circuit section behind the adjacent EL display device, the TFT layer is bent at the boundary between the pixel section and the circuit section.

Alternatively, a step portion that changes the position of the adjacent EL display devices in the thickness direction may be provided so as to dispose the circuit section behind the adjacent EL display device.

Alternatively, the adjacent EL display devices may be inverted so as to arrange the base layers of the adjacent EL display devices in the same plane.

DETAILED DESCRIPTION OF THE PREFERRED EMBODIMENTS

Figure 1:
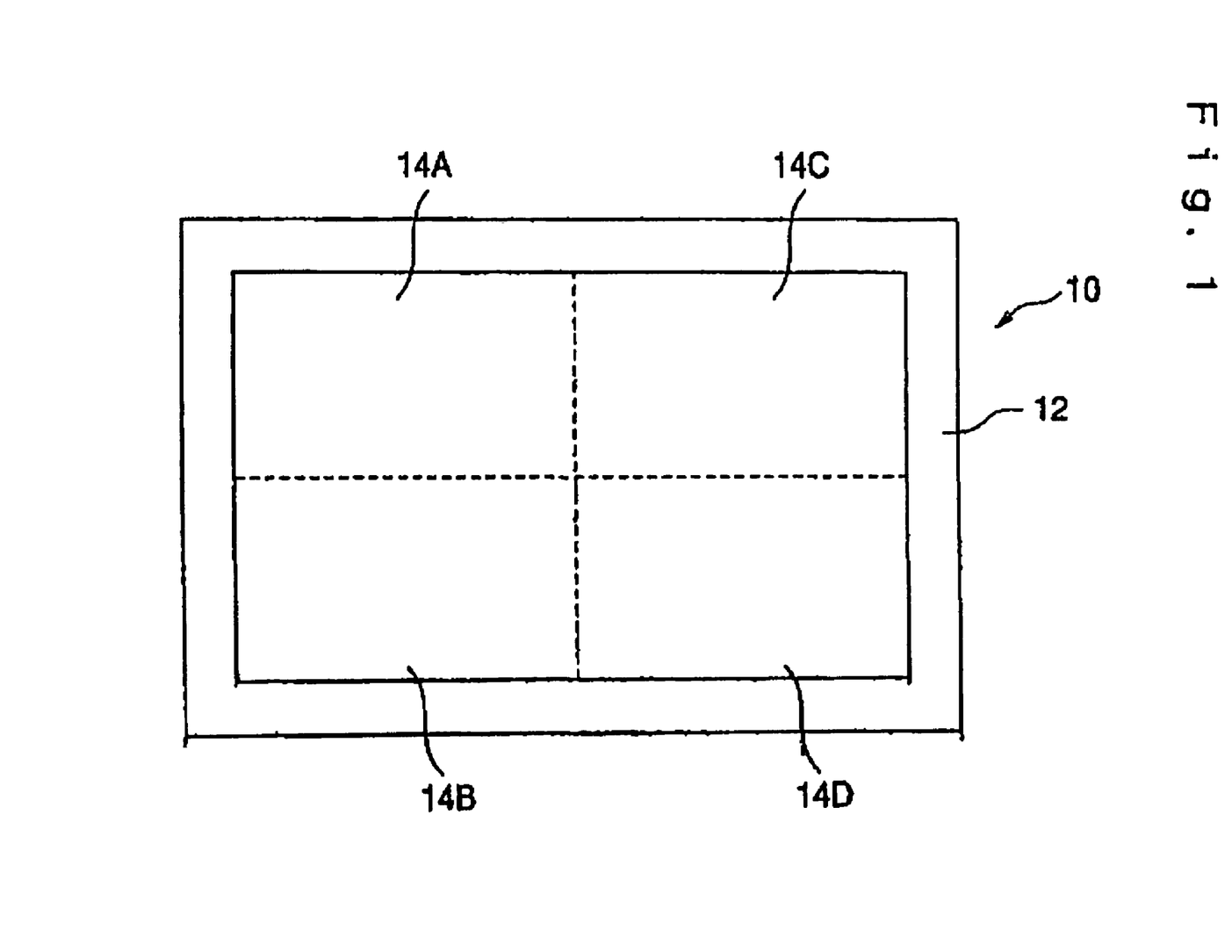
FIG. 1 is a front view of a large EL panel according to a first embodiment of the invention.

FIG. 1 shows a large EL display panel 10 according to the present embodiment. The large EL display panel 10 includes a main transparent substrate 12 on which four EL display devices 14A, 14B, 14C, and 14D are arranged in a matrix pattern (in the present embodiment, x×y=2×2). The EL display devices 14A, 14B, 14C, and 14D have the same structure, and are denoted as EL display devices 14 below when they are generically described.

Figure 2:
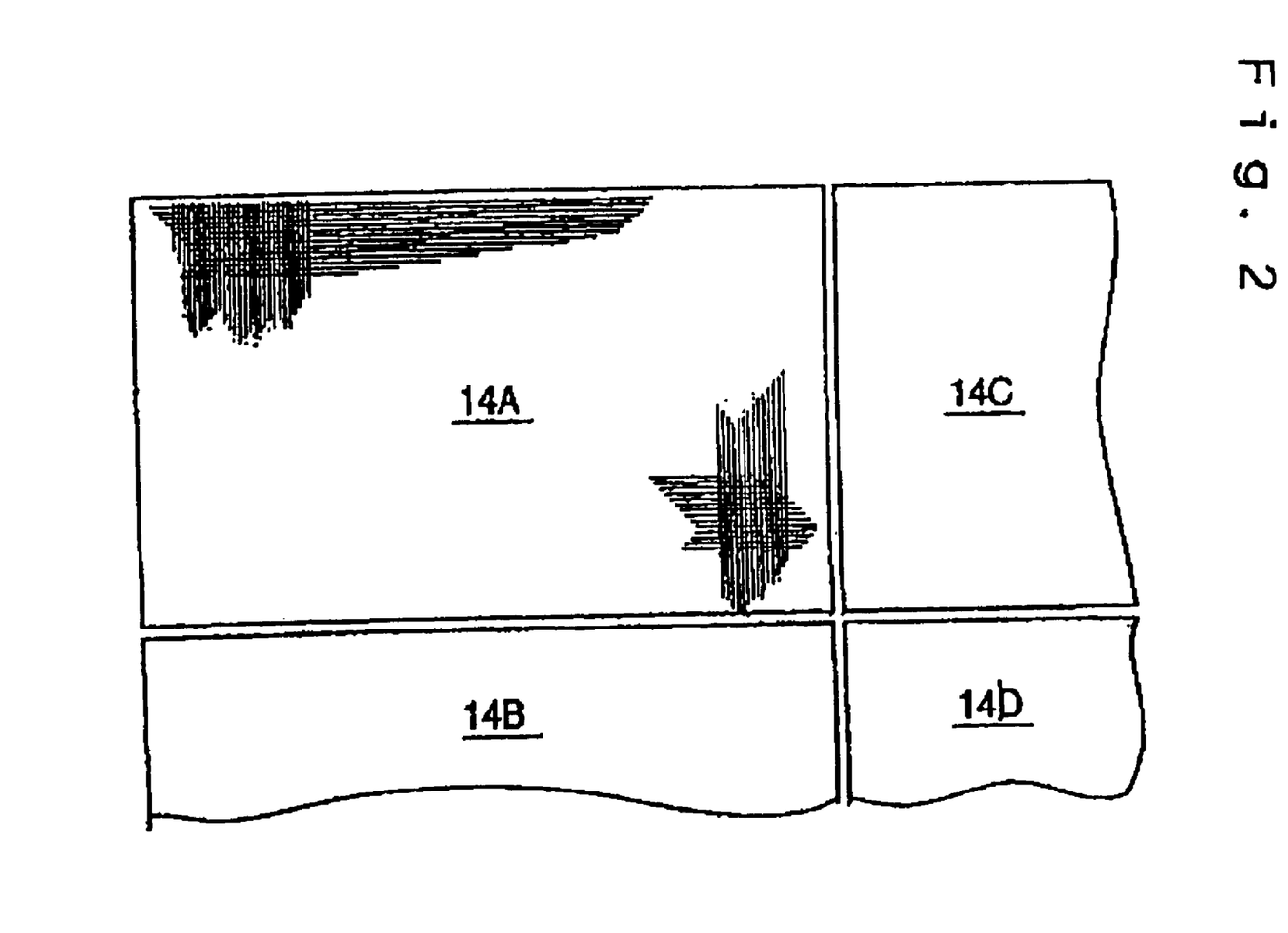
FIG. 2 is an enlarged view of a portion of FIG. 1.

As shown in FIG. 2, the EL display devices 14, which are driven by polysilicon TFTs, are divided into a plurality of pixels, and light emission (and gradation) at each pixel is controlled individually. The EL display devices 14 are limited in size: a single EL display device is several (2 to 6) inches in diagonal length. Thus, to form a display, which is, for example, a dozen inches to a hundred inches in diagonal length, a plurality of EL display devices 14 must be arranged in a matrix pattern.

In FIG. 1, a display which is approximately 20 inches in diagonal length is constructed by the four EL display devices 14. This size is approximately the same as the size "A3" according to the Japanese Industrial Standard (JIS).

Figure 3:
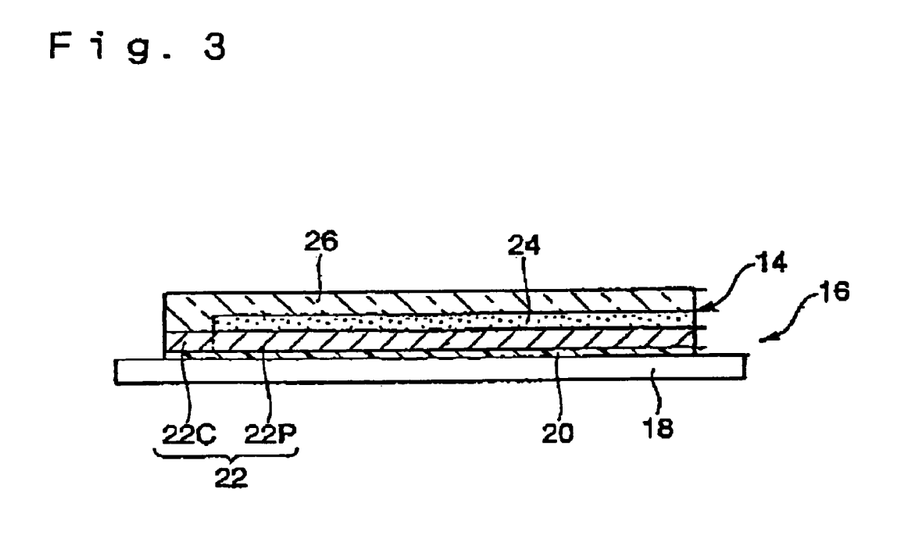
FIG. 3 is a sectional view of an EL display device.

FIG. 3 shows a sectional view of one of the EL display devices 14.

The EL display device 14 incorporated in the present embodiment is prepared as a product, that is, an EL panel 16, in which the EL display device 14 is laminated on a sub-transparent substrate 18 via an adhesive layer 20.

Figure 4:
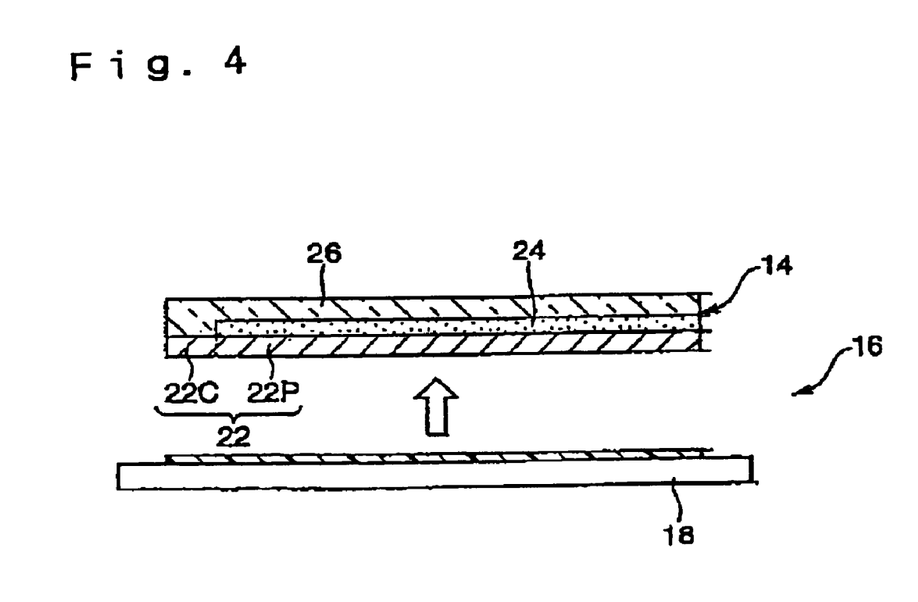
FIG. 4 is a sectional view of the EL display device and a sub-transparent substrate, which are separated from each other.

More specifically, in the EL panel 16, the EL display device 14 is supported by the sub-transparent substrate 18 in a manner such that the EL display device 14 is parallel to the sub-transparent substrate 18. In the present embodiment, the EL display device 14 is separated from the sub-transparent substrate 18 at the adhesive layer 20, as shown in FIG. 4. By using a separation and transfer technique, only the EL display device 14 is removed from the sub-transparent substrate 18.

The EL display device 14 is constructed of a laminate including a plurality of layers.

The bottom layer of the EL display device 14 is a TFT layer 22 which includes a pixel section 22P and a circuit section 22C. The pixel section 22P is divided in a matrix pattern, and is provided with a plurality of pixels. Light emission of a fluorescent material, which will be described below, at each pixel is controlled individually.

The circuit section 22C includes a driver that controls the light emission at each pixel, and is disposed along two adjoining sides of the TFT layer 22.

A base layer 24 on which the fluorescent material is applied is laminated over the pixel section 22P of the TFT layer 22. In addition, a transparent electrode layer 26 is laminated so as to cover both the base layer 24 and the circuit section 22C. The transparent electrode layer 26 also functions as a protection layer.

When a current is applied to some particular pixels by the driver included in the circuit section 22C of the TFT layer 22, a potential difference is generated between the TFT layer 22 and the transparent electrode layer 26. Accordingly, the fluorescent material contained in the base layer 24 at the corresponding positions emits light. In the present embodiment, the pixels are divided into groups of three, each group providing three colors, RGB, so that color images may be displayed.

Figure 5:
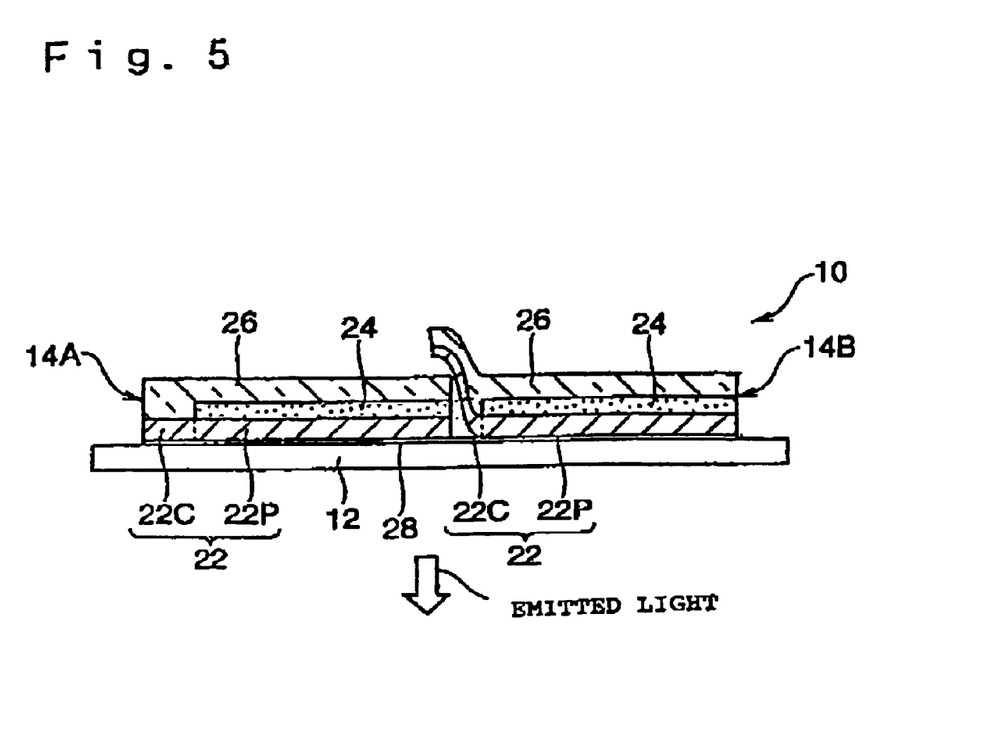
FIG. 5 is a sectional view of EL display devices which are adjacently disposed on a main transparent.
Figure 6:
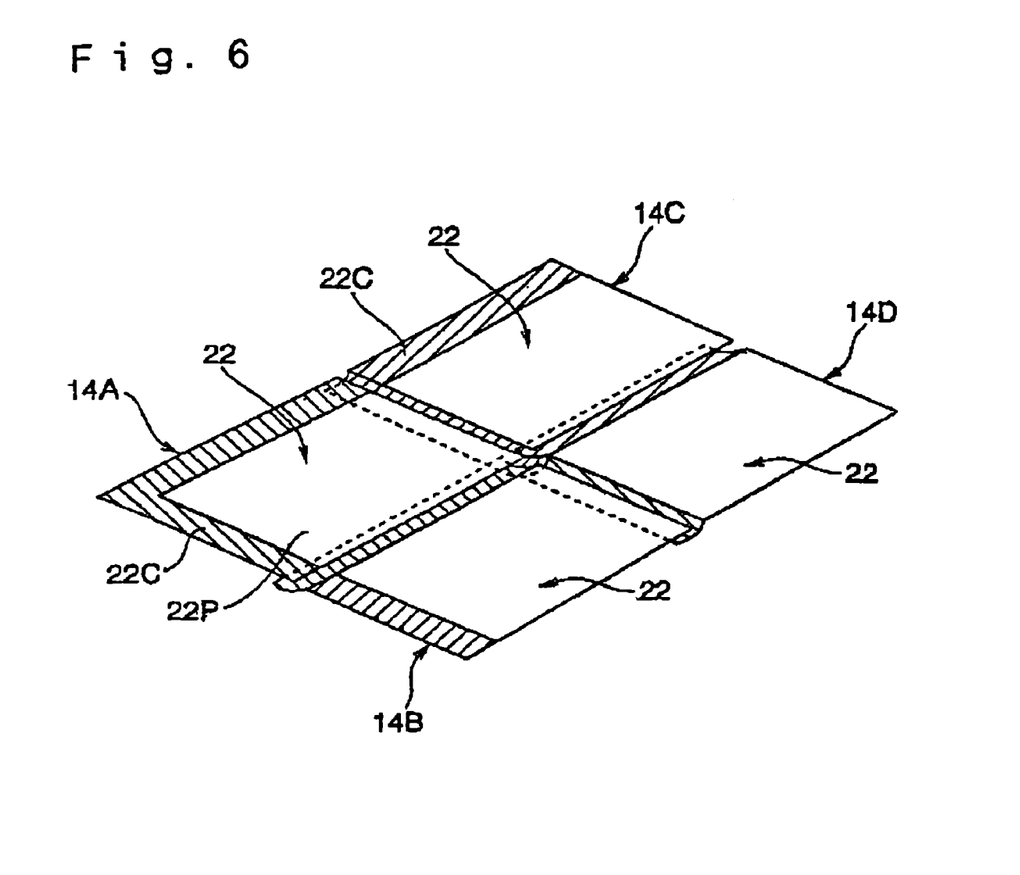
FIG. 6 is a perspective view showing a manner in which circuit sections of TFT layers are disposed under the adjacent EL display devices.
Figure 7:
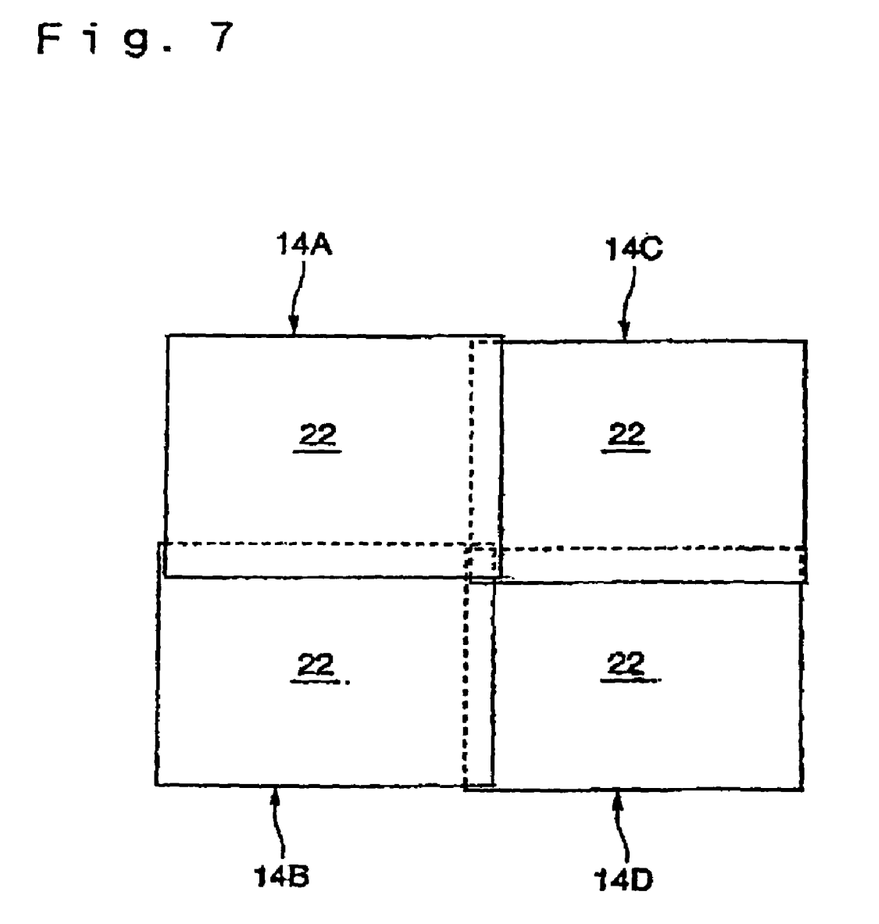
FIG. 7 is a front view of the EL display devices which are disposed adjacently to each other on the main substrate.

Now, the above-described case is considered in which the four EL display devices 14 are arranged and laminated on the main transparent substrate 12 via an adhesive layer 28. In such a case, the circuit section 22C of the TFT layer 22 would cause a large gap between the pixels disposed at the peripheries of two adjacent EL display devices 14. Thus, in the present embodiment, the TFT layer 22 is bent at the boundary between the circuit section 22C and the pixel section 22P so as to dispose the circuit section 22C behind the adjacent EL display device 14, as shown in FIGS. 5 to 7. Accordingly, the pixels at the peripheries of adjacent EL display devices 14 may be arranged in proximity to each other.

Figure 8:
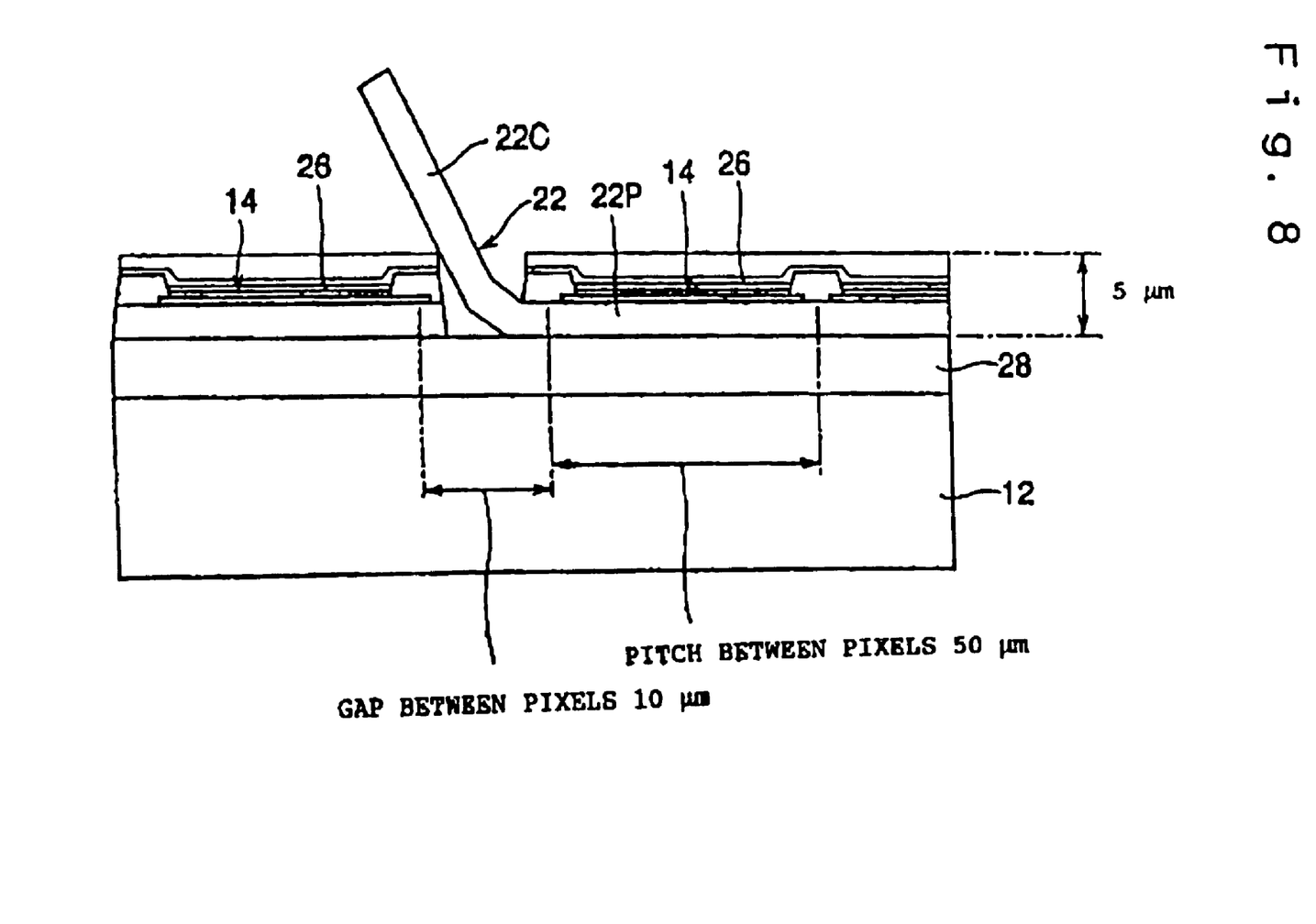
FIG. 8 is a detailed sectional view of the adjacent EL display devices which are disposed on the main substrate.

As shown in FIG. 8, the gap between the pixels at the peripheries of adjacent EL display devices 14 may be reduced to 10 µm. The pitch between the pixels is 50 µm, the thickness of the TFT layers is 1 µm, and the thickness of the EL display devices 14 is 5 µm.

The operation of the present embodiment will be explained below in conjunction with a manufacturing process of the large EL display panel 10.

First, a plurality of EL panels 16 is prepared so that a display having a desired diagonal length will be obtained. In the present embodiment, four EL panels 16 are prepared.

In each of the EL panels 16, the required EL display device 14 is laminated on the sub-transparent substrate 18 by the adhesive layer 20. The EL display device 14 is removed from the sub-transparent substrate 18 at the adhesive layer 20 by applying the above-described separation and transfer technique.

The EL display devices 14 obtained from the EL panels 16 are arranged on the main transparent substrate 12 in a matrix pattern (2×2).

At this time, the circuit section 22C of the TFT layer 22 would overlap on the adjacent EL display device 14. To avoid this, the TFT layer 22 is bent at the boundary between the circuit section 22C and the pixel section 22P so as to dispose the circuit section 22C behind the adjacent EL display device 14.

The four EL display devices 14 are laminated on the main transparent substrate 12 by the adhesive layer 28 in a similar manner.

Accordingly, the circuit sections 22C of the TFT layers 22 are disposed behind the adjacent EL display devices 14, so that the gap between the pixels at the peripheries of the adjacent EL display devices 14 may be 10 µm. Thus, the four EL display devices 14A, 14B, 14C, and 14D appear to be unified, forming the large EL display panel 10.

(Second Embodiment)

A second embodiment of the present invention will be described below. The components which are similar to those in the first embodiment are denoted by the same reference numerals, and descriptions thereof are omitted.

Figure 9:
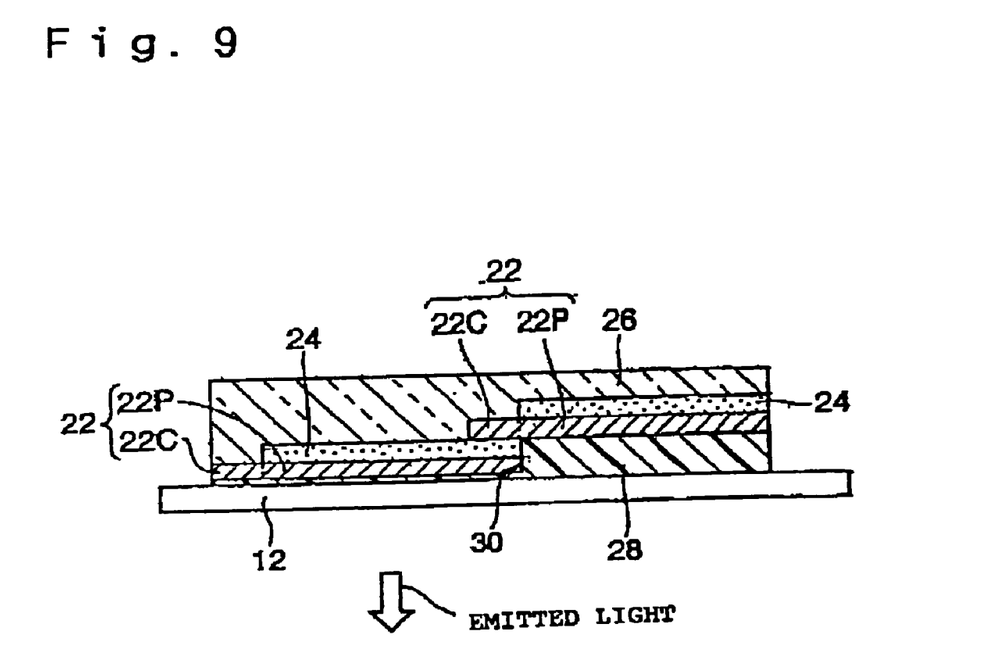
FIG. 9 is a sectional view of a large EL panel according to a second embodiment of the present invention, showing a structure in which the circuit section of the TFT layer is disposed.

In the second embodiment, the circuit section 22C of the TFT layer 22 is disposed in a manner such that the TFT layer 22 is not bent at the boundary between the circuit section 22C and the pixel section 22P.

As shown in FIG. 9, the main transparent substrate 12 is provided with a step portion 30 formed by the adhesive layer 28 which is used for laminating and fixing the EL display devices 14. The step portion 30 is provided so as to change the positions of adjacent EL display devices 14 in the thickness direction.

The height of the step portion 30 corresponds to the total thickness of the TFT layer 22 and the base layer 24. Accordingly, the circuit section 22C may be disposed behind the adjacent EL display device 14 without bending the TFT layer 22.

(Third Embodiment)

A third embodiment of the present invention will be described below. The components which are similar to those in the first embodiment are denoted by the same reference numerals, and descriptions thereof are omitted.

Figure 10:
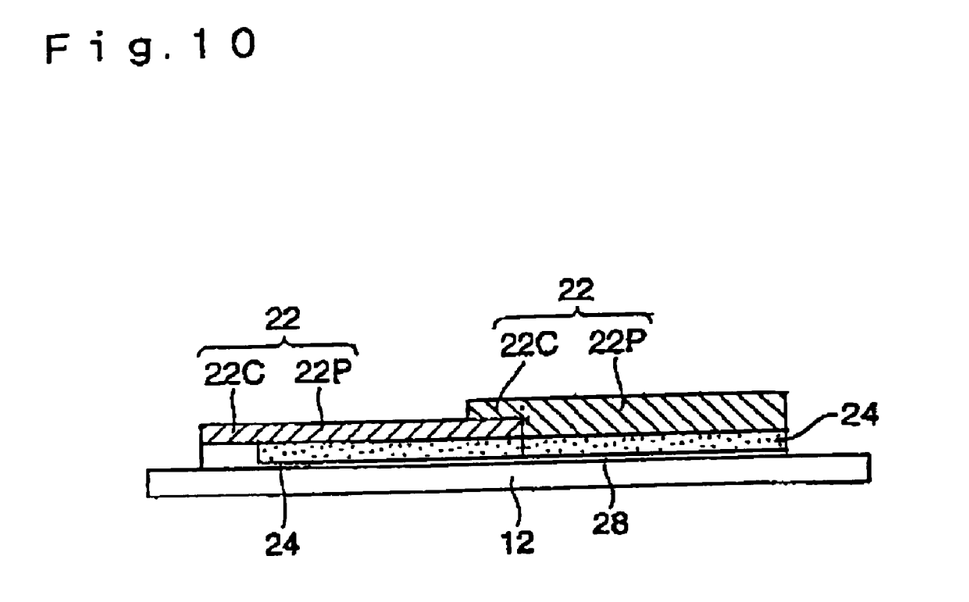
FIG. 10 is a sectional view of a large EL panel according to a third embodiment of the present invention, showing a structure in which the circuit section of the TFT layer is disposed.

In the third embodiment, the circuit section 22C of the TFT layer 22 is also disposed in a manner such that the TFT layer 22 is not bent at the boundary between the circuit section 22C and the pixel section 22P.

As shown in FIG. 10, in the third embodiment, the transparent electrode layer (not shown) is laminated on the main transparent substrate 12 as a first layer. In addition, the base layer 24 is provided as a second layer, and the TFT layer 22 is provided as a third layer. Accordingly, the transparent electrode layer, the base layer 24, and the TFT layer 22 are laminated inversely compared to the manner in the first and the second embodiment. In addition, the thickness of the pixel section 22P of the TFT layer 22 is double compared to that in the adjacent EL display device 14, which is the standard thickness. The base layer 24 is fixed to the main transparent substrate 12 via an adhesive layer 28.

Accordingly, the circuit section 22C is disposed behind the adjacent EL display device 14 without bending the TFT layer 22.

In the above-described second and third embodiments, the process of bending the TFT layer 22 at the boundary between the circuit section 22C and the pixel section 22P is not required. Thus, although modifications, such as changing of the thickness of the layers, are required, the TFT layer 22 does not receive any load, so that problems, such as contact failures, are avoided.

(Fourth Embodiment)

Figure 11:
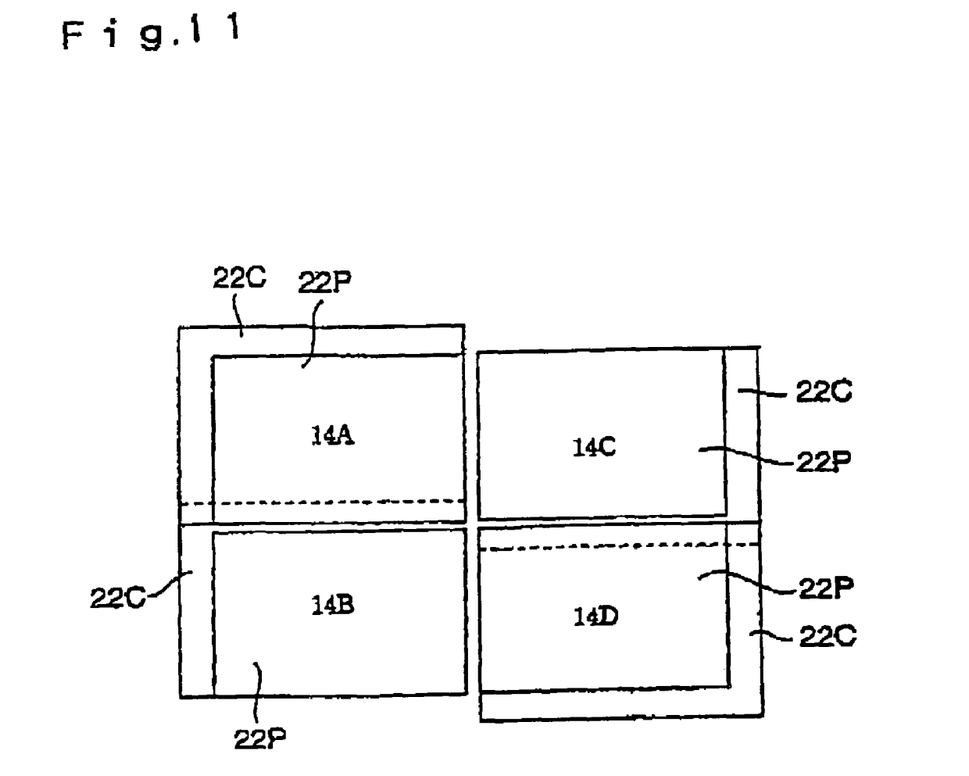
FIG. 11 is a front view of TFT layers including circuit sections, which are incorporated in a fourth embodiment of the present invention.

The following embodiment may only be applied when four EL display devices 14 are provided. FIG. 11 shows a first modification in which the four EL display devices 14 are arranged in proximity to each other. In this case, four similar EL display devices 14 are prepared, and the two EL display devices 14 disposed in the right side and the two EL display devices 14 disposed in left side are arranged inversely to each other. Accordingly, the circuit sections 22C of the TFT layers 22 are prevented from overlapping on the adjacent EL display devices 14.

(Fifth Embodiment)

Figure 12:
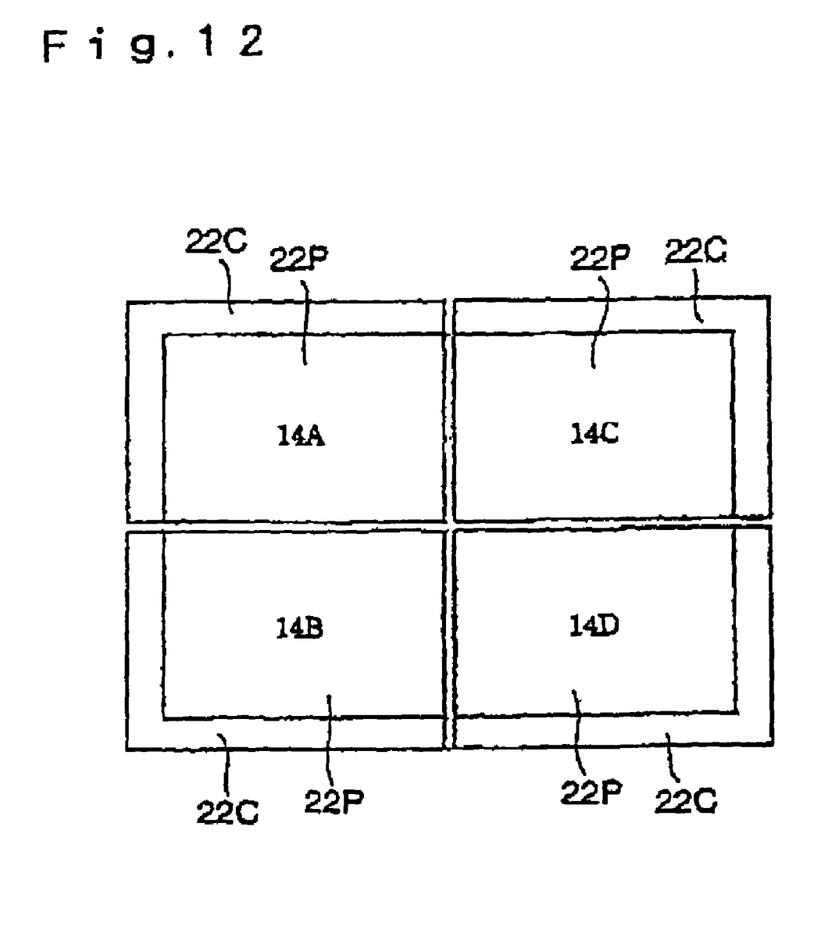
FIG. 12 is a front view of TFT layers including circuit sections, which are incorporated in a fifth embodiment of the present invention.

FIG. 12 shows a second modification in which the EL display devices 14 disposed at the right side and at the left side have different structures. More specifically, the circuit sections 22C are disposed at symmetrical regions in the TFT layers 22. According to such a structure, the circuit sections 22C do not overlap on the adjacent EL display devices 14.

Although the large EL display panel 10 is constructed of the four EL display devices 14A, 14B, 14C, and 14D in the present embodiment, it is also possible to construct a larger panel.

Figure 13:
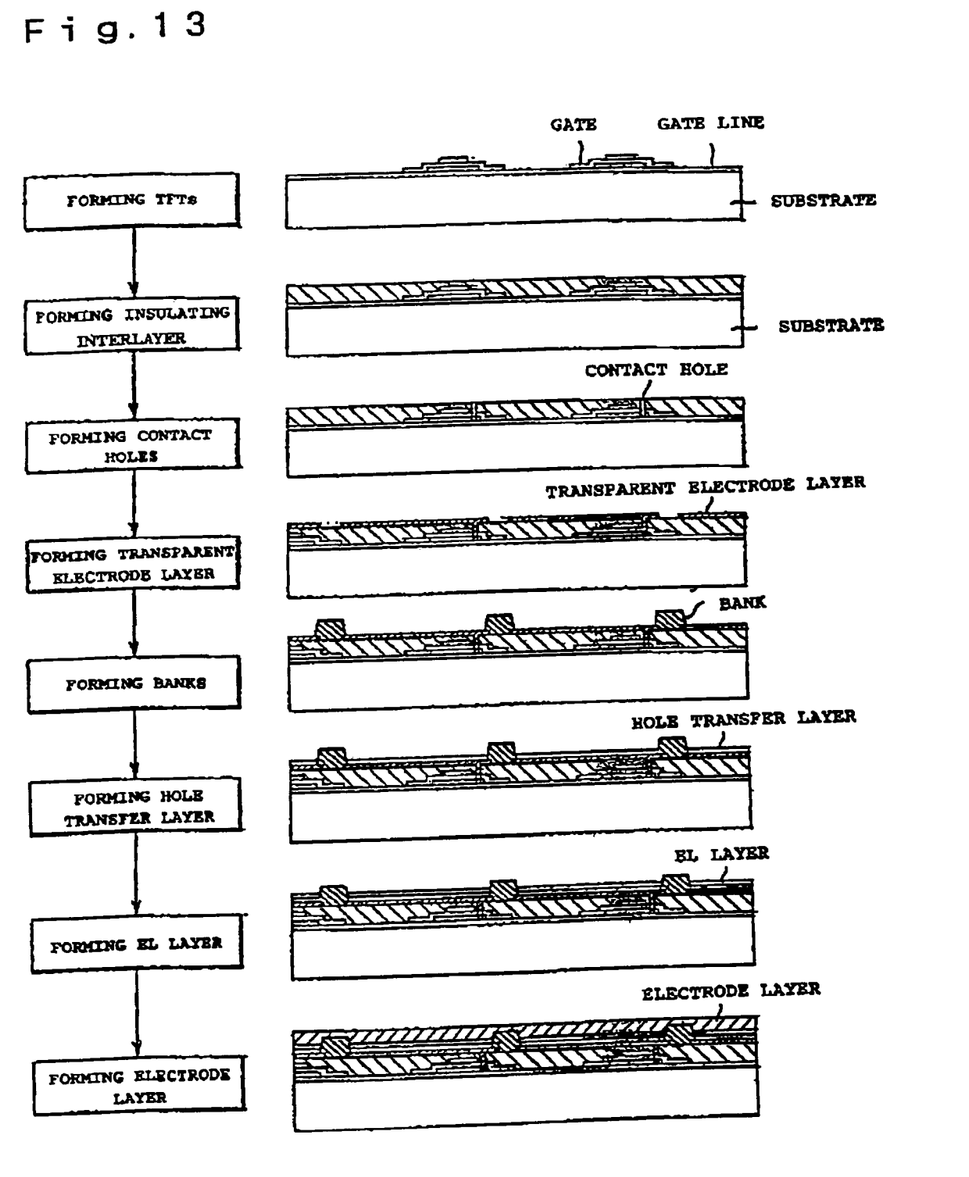
FIG. 13 is a chart showing a manufacturing process for EL panels.

FIG. 13 shows an actual manufacturing process of the EL panel 16 which is used to achieve a large EL display panel 10.

The EL display devices 14 are formed by the processes shown in FIG. 13, which are described in order starting from the top. The order of the processes is: forming TFTs→forming an insulating interlayer→forming contact holes→forming a transparent electrode layer→forming banks→forming a hole transfer layer→forming an EL layer→forming an electrode layer.

As described above, the following advantages are achieved by the large EL and the manufacturing method thereof according to the present invention. That is, in the case in which a plurality of EL display devices are arranged in a matrix pattern, the pitch between the pixels provided in the pixel section of the TFT array is maintained constant.

What is claimed is:

1. A method of manufacturing a large EL panel which includes a plurality of EL display panels, each of the plurality of EL display panels being formed of an EL display device and a sub-transparent substrate that supports the EL display device in parallel, the EL display device including: a base layer over which a luminescent material is applied; an electrode layer which is laminated on one side of the base layer; and a TFT layer including a circuit section in which light emission of the luminescent material is controlled by applying a predetermined voltage between the electrode layer and the TFT layer and a pixel section which is superimposed over another side of the base layer opposite the one side and which is provided with a plurality of pixels which divide the base layer into sections so that light emission of the luminescent material in each section is individually controlled by generating a potential difference between the electrode layer and the TFT layer at the corresponding section, the method of manufacturing comprising:
removing the EL display devices from the sub transparent substrates;
arranging the obtained EL display devices on a main transparent substrate, which is broader than the sub-transparent substrate, in a matrix pattern and in a manner such that light emitting areas of the adjacent EL display devices are in proximity to each other; and
disposing and fixing the circuit section of the TFT layer, which is disposed at a region outside the light emitting area, behind an adjacent EL display device.

2. The manufacturing method for a large EL panel according to claim 1, the fixing including fixing the circuit section of the TFT layer in a manner such that the TFT layer is bent at a boundary between the circuit section, and the pixel section and the circuit section is disposed behind an adjacent EL display device.

3. The manufacturing method for a large EL panel according to claim 1, further including changing a thickness of an adhesive layer used to laminate the EL display devices on said main transparent substrate so as to form a step portion which changes positions of the adjacent EL display devices in a thickness direction, so that said circuit section is disposed behind an adjacent EL display device.

4. The manufacturing method for a large EL panel according to claim 1, further including inverting adjacent EL display devices, and increasing a thickness of said pixel portion of said TFT layer so as to compensate for displacement between the base layers of adjacent EL display devices, which is caused as a result of the inverting steps, so that said circuit section is disposed behind the adjacent EL display device.

5. A manufacturing method of an EL panel comprising:
providing a substrate;
disposing a first EL display element including a TFT layer above the substrate, the TFT layer including a plurality of first pixel sections that are arranged in the first EL display element and a first circuit section, each of the first pixel sections being capable of emitting lights, and the first circuit section controlling the emissions of the first pixel sections; and
disposing a second EL display element including a TFT layer above the substrate so as to be arranged adjacent to the first EL display element, the TFT layer including a plurality of second pixel sections are arranged in the second EL display element, each of the second pixel sections being capable of emitting lights, the first circuit section and the second EL display element overlapping with each other such that a pitch between adjacent ones of the first pixel sections and the second pixel sections being approximately constant with a pitch between adjacent ones of the first pixel sections.

6. The manufacturing method of an EL panel according to claim 5, a second circuit section controlling the emissions of the second pixel sections, the method further comprising:
disposing a third EL display element that overlaps with the second circuit section, a plurality of third pixel sections arranged in the third EL element, each of the third pixel sections being capable of emitting lights,
wherein a pitch between adjacent ones of the second pixel sections and the third pixel sections is approximately constant with at least one of a pitch between adjacent ones of the first pixel sections and a pitch between adjacent ones of the second pixel sections.

7. The manufacturing method of an EL panel according to claim 5, wherein the second EL display element emits light from a first side, and wherein the second EL element overlaps with the first circuit section at a second side opposite to the first side.

8. The manufacturing method of an EL panel according to claim 5, said substrate being transparency and supporting said second EL display element from said second side thereof.

9. The manufacturing method of an EL panel according to claim 8, wherein said first EL display element and said second EL element are adjoined by adhesive material.

10. The manufacturing method of an EL panel according to claim 5, further comprising:
connecting the first circuit section and the first pixel sections to each other; and
bending the first circuit section such that the first circuit section overlaps with the second EL display element.

11. The manufacturing method of an EL panel according to claim 5, further comprising:
forming a layer that fills a gap formed between the second EL display element and the first circuit section.

12. The manufacturing method of an EL according to claim 5, wherein the thickness of the first circuit section is thinner than that of the first pixel sections.

* * * * *